(12) United States Patent
Lee et al.

(10) Patent No.: US 12,256,500 B2
(45) Date of Patent: Mar. 18, 2025

(54) CIRCUIT BOARD AND MANUFACTURING METHOD THEREFOR

(71) Applicant: STEMCO CO., LTD., Cheongju-si (KR)

(72) Inventors: Jin Han Lee, Cheongju-si (KR); Sung Jin Lee, Cheongju-si (KR); Jin Ho Kim, Cheongju-si (KR)

(73) Assignee: STEMCO CO., LTD., Cheongju-si (KR)

( * ) Notice: Subject to any disclaimer, the term of this patent is extended or adjusted under 35 U.S.C. 154(b) by 283 days.

(21) Appl. No.: 17/753,169

(22) PCT Filed: Jul. 31, 2020

(86) PCT No.: PCT/KR2020/010136
§ 371 (c)(1),
(2) Date: Feb. 22, 2022

(87) PCT Pub. No.: WO2021/033951
PCT Pub. Date: Feb. 25, 2021

(65) Prior Publication Data
US 2022/0287185 A1      Sep. 8, 2022

(30) Foreign Application Priority Data
Aug. 22, 2019    (KR) .................. 10-2019-0102852

(51) Int. Cl.
*H05K 1/18*    (2006.01)
*H05K 1/11*    (2006.01)
*H05K 3/28*    (2006.01)

(52) U.S. Cl.
CPC ............. *H05K 3/282* (2013.01); *H05K 1/111* (2013.01); *H05K 1/18* (2013.01); *H05K 2201/10674* (2013.01)

(58) Field of Classification Search
CPC .. H05K 3/282; H05K 1/18; H05K 2203/0591; H01L 23/12; H01L 23/3171; H01L 21/4846
See application file for complete search history.

(56) References Cited

U.S. PATENT DOCUMENTS 5,798,285 A * 8/1998 Bentlage .................. H01L 24/16
                                                              438/599
5,808,873 A * 9/1998 Celaya ................ H01L 23/3121
                                                              257/676

(Continued)

FOREIGN PATENT DOCUMENTS

CN    106548992 A    3/2017
JP    H05-226505 A   9/1993

(Continued)

OTHER PUBLICATIONS

International Search Report for PCT Application No. PCT/KR2020/010136, dated Dec. 24, 2020, in 5 pages.

(Continued)

*Primary Examiner* — Ishwarbhai B Patel
(74) *Attorney, Agent, or Firm* — Knobbe, Martens, Olson & Bear, LLP (57) ABSTRACT

A circuit board includes: a base substrate in which a protective layer formation region is defined; a wiring pattern which is formed on the base substrate and which has at least a portion formed in the protective layer formation region; a protective layer fixed onto the protective layer formation region and formed of a protective material; and a bleed prevention pattern formed on the base substrate so as to prevent the protective material from flowing beyond the protective layer formation region when the protective layer is formed.

11 Claims, 4 Drawing Sheets

(56) References Cited

U.S. PATENT DOCUMENTS

| | | | |
|---|---|---|---|
| 7,473,852 B2* | 1/2009 | Higashiguchi | H05K 3/3452 |
| | | | 257/E21.511 |
| 8,592,959 B2* | 11/2013 | Fujii | H01L 23/13 |
| | | | 257/664 |
| 2002/0043704 A1* | 4/2002 | Seko | H01L 23/49838 |
| | | | 257/E21.503 |
| 2009/0154128 A1* | 6/2009 | Tamadate | H01L 21/563 |
| | | | 361/783 |
| 2010/0123157 A1 | 5/2010 | Chen et al. | |
| 2012/0120624 A1* | 5/2012 | Tamadate | H01L 21/563 |
| | | | 361/783 |

FOREIGN PATENT DOCUMENTS

| | | |
|---|---|---|
| JP | H11-284032 A | 10/1999 |
| JP | 2002-009409 A | 1/2002 |
| JP | 2004-103712 A | 4/2004 |
| JP | 2005-183740 A | 7/2005 |
| JP | 2018-006655 A | 1/2018 |
| KR | 10-1998-0073214 A | 11/1998 |
| KR | 10-2004-0048695 A1 | 6/2004 |
| KR | 10-2008-0026671 A | 3/2008 |
| KR | 10-2011-0017779 A | 2/2011 |
| KR | 10-2011-0065029 A | 6/2011 |
| KR | 10-2013-0090644 A | 8/2013 |
| KR | 10-1317952 B1 | 10/2013 |
| TW | 565926 B | 12/2003 |

OTHER PUBLICATIONS

Office Action dated Oct. 3, 2023 in Japanese Application No. 2022-512711 in 6 pages.

* cited by examiner

CIRCUIT BOARD AND MANUFACTURING METHOD THEREFOR

CROSS-REFERENCE TO RELATED APPLICATION

This application claims priority to and the benefit of Korean Patent Application No. 10-2019-0102852, filed on Aug. 22, 2019, the disclosure of which is incorporated herein by reference in its entirety.

TECHNICAL FIELD

The present invention relates to a circuit board and a manufacturing method therefor, and more particularly, to a circuit board including a wiring pattern on a base substrate and a manufacturing method therefor.

BACKGROUND

Recently, with the trend of miniaturization of electronic devices, a chip on film (COF) package technology using a circuit board has been widely used. For example, a flexible circuit board and a COF package technology using the same are adopted in a flat panel display (FPD) such as a liquid crystal display (LCD) and an organic light emitting diode (OLED) display device. A chip such as a DDIC (Display Driver IC) for driving a flat panel display may be mounted on such a flexible circuit board.

In general, a flexible circuit board includes a protective layer for preventing damage to a wiring pattern formed thereon. The protective layer may be formed of a protective material of various materials, and among them, when the protective layer is formed of an ink-type protective material, the protective material applied on the wiring pattern tends to bleed to the surrounding area before curing. When the protective material bleeds to the inner lead region where the semiconductor chip is mounted, it interferes with the connection between the pad part of the chip and the wiring pattern, leading to deterioration of quality. (Patent Document 1) Korean Laid-Open Patent Publication No. 10-2004-0048695

SUMMARY

Technical Task

The present invention is to solve the problems of the related art described above, and is directed to providing a circuit board and a manufacturing method therefor for preventing a protective material for forming a protective layer for preventing damage to a wiring pattern from bleeding to other regions of a board.

In addition, the present invention is directed to providing a circuit board and a manufacturing method therefor for effectively preventing a protective material for forming a protective layer for preventing damage to a wiring pattern from bleeding to an inner lead region of a board on which a chip is mounted.

The present invention is not limited to those mentioned above, and other problems not mentioned will be clearly understood by those of ordinary skill in the art from the following description.

Technical Solution

According to an aspect of the present invention, provided is a circuit board, comprising: a base substrate in which a protective layer formation region is defined; a wiring pattern which is formed on the base substrate and which has at least a portion formed in the protective layer formation region; a protective layer fixed onto the protective layer formation region and formed of a protective material; and a bleed prevention pattern formed on the base substrate so as to prevent the protective material from flowing beyond the protective layer formation region when the protective layer is formed substrate.

In this case, an inner lead region in which a chip is mounted may be additionally defined in the base substrate, and the bleed prevention patter may be formed in a portion of the protective layer formation region adjacent to a corner portion of the inner lead region.

In addition, the bleed prevention pattern may include a first portion formed to surround the corner portion.

In addition, the bleed prevention pattern may further include a second portion extending from an end of the first portion in a direction away from the inner lead region.

In addition, the bleed prevention pattern may further include a third portion formed at a predetermined angle with the second portion so as to surround a predetermined region together with the first portion and the second portion.

In addition, the bleed prevention pattern may be formed in a protruding pattern.

In addition, the bleed prevention pattern may be formed to have the same height as the wiring pattern.

In addition, the bleed prevention pattern may include an accommodating portion for accommodating the protective material in the protruding pattern.

In addition, the accommodating portion may be formed engraved in the protruding pattern.

According to another aspect of the present invention, provided is a method for manufacturing a circuit board, comprising: preparing a base substrate in which a protective layer formation region is defined; forming on the base substrate a wiring pattern and a bleed prevention pattern that is applied to the protective layer formation region to prevent the protective material forming a protective layer from flowing beyond the protective layer formation region; and forming the protective layer by applying a protective material on the protective layer formation region.

In this case, in the forming a pattern, the bleed prevention pattern may be formed in a protruding pattern.

In addition, in the forming a pattern, the bleed prevention pattern may be formed to have the same height as the wiring pattern.

In addition, in the forming a pattern, the bleed prevention pattern may include an accommodating portion engraved in the protruding pattern to accommodate the protective material.

Effects

According to an embodiment of the present invention, when the protective layer for protecting the wiring pattern is formed on the circuit board, through the bleed prevention pattern, it is possible to prevent the protective material from flowing to other regions of the board beyond the protective layer formation region.

In addition, according to an embodiment of the present invention, through the bleed prevention pattern, it is possible to effectively prevent the protective material from penetrating beyond the protective layer formation region into the inner lead region where the chip is mounted.

The effects of the present invention are not limited to those mentioned above, and other effects not mentioned will be clearly understood by those of ordinary skill in the art from the description of the claims.

DETAILED DESCRIPTION OF EMBODIMENTS

Hereinafter, embodiments of the present invention will be described in detail so that those of ordinary skill in the art can readily implement the present invention with reference to the accompanying drawings. The present invention may be embodied in many different forms and is not limited to the embodiments set forth herein. In the drawings, parts unrelated to the description are omitted for clarity. Throughout the specification, like reference numerals denote like elements.

It is understood that the terms "comprise" or "have" when used in this specification, are intended to specify the presence of stated features, integers, steps, operations, elements, components and/or a combination thereof but not preclude the possibility of the presence or addition of one or more other features, integers, steps, operations, elements, components, or a combination thereof.

In addition, in this specification, spatially relative terms "upper or above or top" or "lower or below or bottom" etc. may be used to describe a correlation with the elements shown in the drawings. These are relative terms determined based on what is shown in the drawings, and the vertical relationship may be conversely interpreted according to the orientation.

In addition, the presence of an element in/on "above" or "below" of another element includes not only being disposed in/on "above" or "below" directly in contact with other elements, but also cases in which another element being disposed in the middle, unless otherwise specified.

Figure 1:
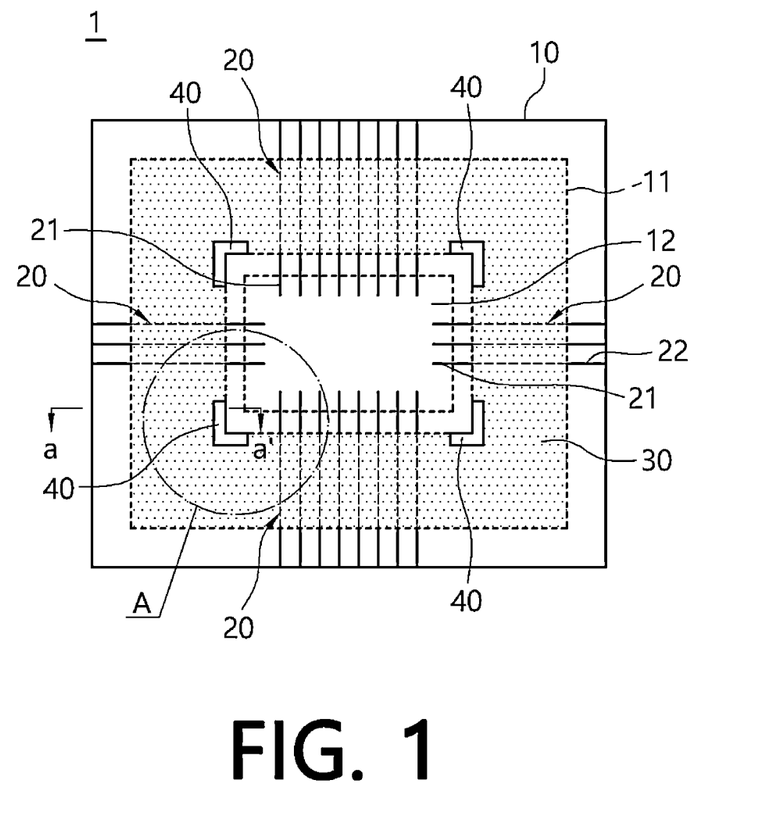
FIG. 1 is a top plan view of a circuit board according to an embodiment of the present invention.

FIG. 1 is a plan view of a circuit board according to an embodiment of the present invention. In addition, FIG. 2 is an enlarged view of part A in FIG. 1, and FIG. 3 is a cross-sectional view taken along line a-a' of FIG. 1.

Figure 2:
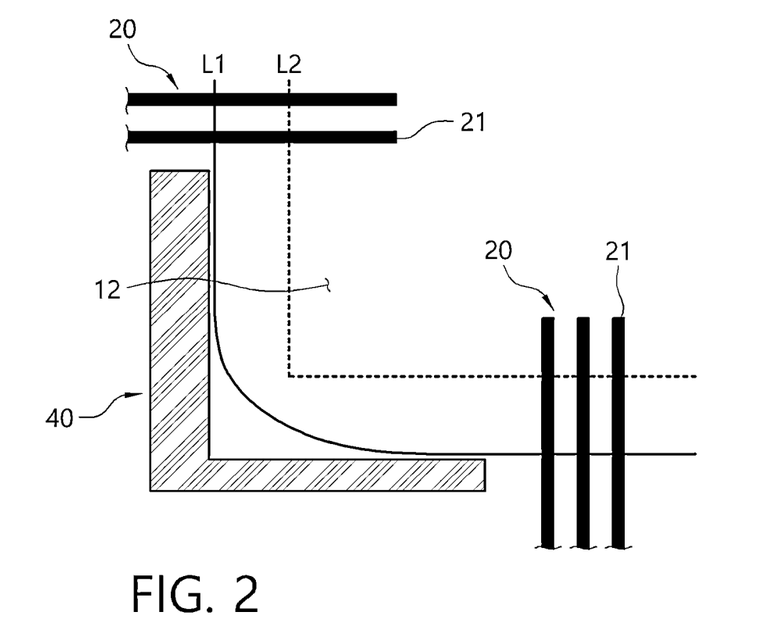
FIG. 2 is an enlarged view of part A in FIG. 1.
Figure 3:
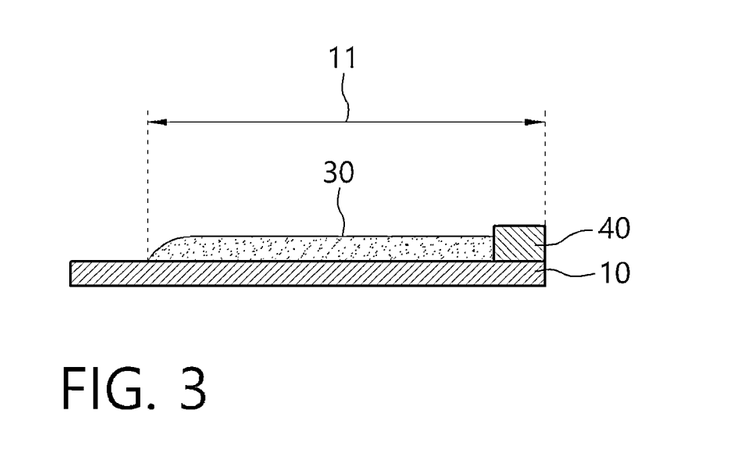
FIG. 3 is a cross-sectional view taken along line a-a' of FIG. 1.

Referring to FIGS. 1 to 3, the circuit board 1 according to an embodiment of the present invention includes a base substrate 10, a wiring pattern 20, a protective layer 30, and a bleed prevention pattern 40.

The base substrate 10 is included as a base material of the circuit board 1. The base substrate 10 may be formed of a flexible material to enable the circuit board 1 to be folded. The base substrate 10 may be made of an insulating material. Specifically, in an embodiment of the present invention, the base substrate 10 may be a polyimide (PI) film.

In addition, the base substrate 10 may be made of one or more of the materials selected from the polymer group including polyester (PE), polyethylene terephthalate (PET), polyethylene naphthalene (PEN), and polycarbonate (PC) or the like. Meanwhile, the base substrate 10 may be made of a metal foil such as an aluminum oxide foil.

In an embodiment of the present invention, a protective layer formation region 11 and an inner lead region 12 are defined in the base substrate 10.

The protective layer formation region 11 is a region in which the protective layer 30 is formed to prevent damage to the wiring pattern 20. A protective material is fixed in the protective layer formation region 11 to form the protective layer 30.

The inner lead region 12 is a region in which a chip is mounted. A chip mounted on the inner lead region 12 may be a semiconductor chip. More specifically, the chip mounted on the inner lead region 12 may be a display driver integrated circuit, that is, DDI (Display Driver IC).

In an embodiment of the present invention, one inner lead region 12 is formed in the center of the base substrate 10, and one protective layer formation region 11 is formed to surround the inner lead region 12. Referring to FIG. 1 and FIG. 2, the inner lead region 12 is formed inside the inner lead region boundary line L2 in the center of the base substrate 10, and the protective layer formation region 11 has a shape surrounding the inner lead region 12 and is formed outside the inner lead boundary line L2.

However, the number, position, and shape etc. of the protective layer formation region 11 and the inner lead region 12 are not limited by an embodiment of the present invention. The number, position, and shape etc. of the protective layer formation region 11 and the inner lead region 12 defined on the base substrate 10 may vary according to the circuit configuration of the circuit board.

The wiring pattern 20 is formed on the base substrate 10 to connect a chip mounted on the inner lead region 12 and an external circuit (not shown). The wiring pattern 20 performs electrical connection between the chip mounted on the inner lead region 12 and the external circuit.

At least a portion of the wiring pattern 20 is formed in the protective layer formation region 11. In addition, the wiring pattern 20 includes an inner lead portion 21 disposed in the inner lead region 12 for electrical connection with a chip mounted on the inner lead region 12 and a wiring portion 22 disposed outside the inner lead region 12.

The wiring pattern 20 may be made of a material having high conductivity. For example, the wiring pattern 20 may be made of a conductive metal such as gold, aluminum, or copper.

The wiring pattern 20 is not limited to being formed on one surface of the base substrate 10 and may be formed on the other surface of the base substrate 10 depending on the purpose and shape of the circuit board 1.

The protective layer 30 is formed to protect the wiring pattern 20 from external impacts, corrosion-inducing substances, and the like. Specifically, the protective layer 30 may be formed of a protective material fixed on the protective layer formation region 11 defined on the base substrate 10. In an embodiment of the present invention, the protective material forming the protective layer 30 may be solder resist ink (SR Ink). That is, the protective layer 30 may be formed by applying a solder resist ink on the protective layer formation region 11.

The bleed prevention pattern 40 is formed on the base substrate 10 to prevent the protective material from flowing beyond the protective layer formation region 11 to other regions of the circuit board 1 when the protective layer 30 is formed. The bleed prevention pattern 40 may be formed to prevent the protective material from flowing into the inner lead region 12 beyond the protective layer formation region 11 when the protective layer 30 is formed. For example, the bleed prevention pattern 40 may be formed in a portion adjacent to the inner lead region 12 of the protective layer formation region 11, or at a boundary between the protective layer formation region 11 and the inner lead region 12, or the like.

In more detail, the bleed prevention pattern 40 may be formed at a location about 150 to 250 µm away from the inner lead region 12 of the base substrate 10. The bleed prevention pattern 40 may be formed at a location 200 µm away from the inner lead region 12 of the base substrate 10.

The protective material forming the protective layer 30 serves to protect the wiring pattern 20 from external impact, corrosion-inducing substances, etc., but when the protective material bleeds to the inner lead region 12 where a semiconductor chip is mounted, it interferes with the connection between the pad portion of the chip mounted on the inner lead region 12 and the lead portion 21 of the wiring pattern 20, thereby causing deterioration of the quality of the circuit board 1. In order to prevent such a problem, when the protective layer 30 is formed, the applied protective material needs to be fixed only in the protective layer formation region 11 of the base substrate 10, but not flow to other regions of the base substrate 10, in particular, to the inner lead region 12.

The bleed prevention pattern 40 prevents a bleed phenomenon in which the protective material applied when the protective layer 30 is formed flows to another region of the circuit board 1 beyond the protective layer formation region 11, by blocking the flow of the protective material. That is, the bleed prevention pattern 40 serves as a barrier or a dam against the protective material.

When the protective layer 30 is formed by applying a protective material to the protective layer formation region 11, in the portion where the wiring pattern 20 is not formed among the protective layer formation region 11, there is no element impeding the flow of the protective material compared to the portion on which the wiring pattern 20 is formed, so that the protective material may proceed faster before curing. However, in general, the wiring pattern 20 is not formed at the corner of the inner lead region 12. This means that a portion of the protective layer formation region 11 adjacent to the corner portion of the inner lead region 12 may be a path through which the uncured protective material penetrates into the inner lead region 12.

Referring to FIG. 1 and FIG. 2, in order to solve such a problem, in an embodiment of the present invention, the bleed prevention pattern 40 is formed to have a shape to surround the corner portion in a portion adjacent to the corner portion of the inner lead region 12 of the protective layer formation region 11. That is, the bleed prevention pattern 40 is formed in an "L" shape in a portion adjacent to the corner portion of the inner lead region 12 of the protective layer formation region 11. Accordingly, it is possible to effectively and efficiently prevent the bleed phenomenon.

In addition, referring to FIG. 3, in an embodiment of the present invention, the bleed prevention pattern 40 is formed in a protruding pattern. As such, the bleed prevention pattern 40 may be formed in an embossed pattern protruding on the base substrate 10. The bleed prevention pattern 40 formed as a protruding pattern functions as a barrier against the protective material applied when the protective layer 30 is formed. The protective material whose flow is blocked by the bleed prevention pattern 40 is cured in the protective layer formation region 11 to form the protective layer 30.

In an embodiment of the present invention, the bleed prevention pattern 40 may be made of the same material as the wiring pattern 20. Through this, it is possible to secure the manufacturing efficiency of the circuit board 1 according to the embodiment of the present invention. However, the bleed prevention pattern 40 does not serve to connect the chip mounted on the inner lead region 12 with an external circuit, and thus becomes a kind of dummy pattern from a circuit point of view.

In addition, in an embodiment of the present invention, the bleed prevention pattern 40 may be formed to have the same height as the wiring pattern 20. As described above, the bleed prevention pattern 40 is formed as a dummy pattern in a place where the wiring pattern 20 does not exist in the protective layer formation region 11, and serves to prevent the protective material applied to form the protective layer 30 from flowing into other regions of the circuit board 1 before it is cured, and is thus formed at the same height as the wiring pattern 20.

Figure 4:
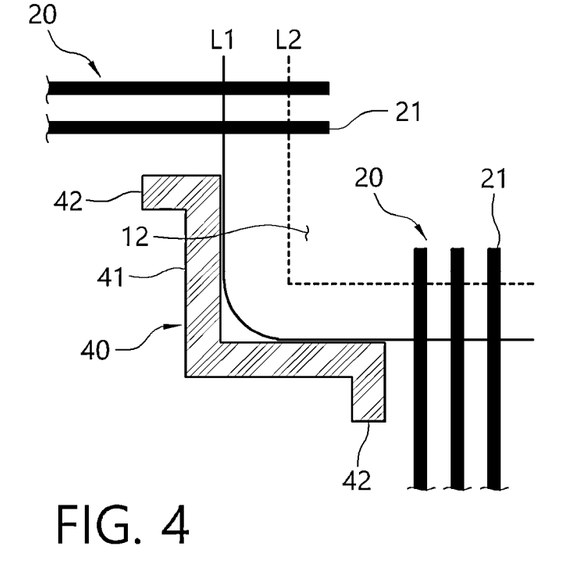
FIGS. 4 to 6 are views illustrating modification examples of a bleed prevention pattern of a circuit board according to an embodiment of the present invention.
Figure 5:
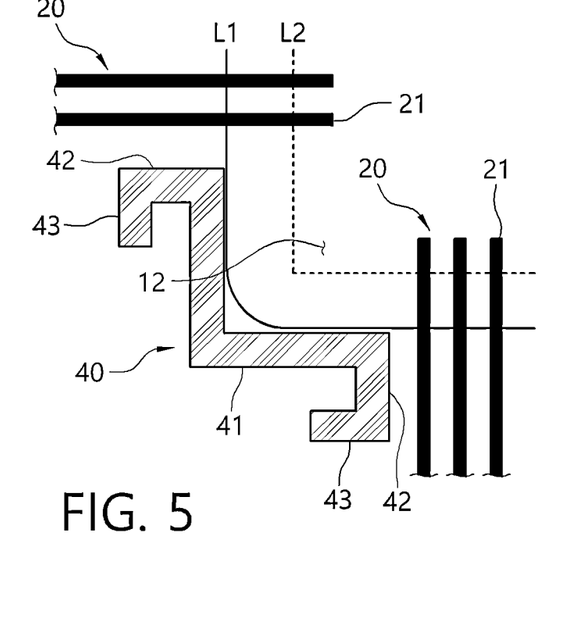
Figure 6:
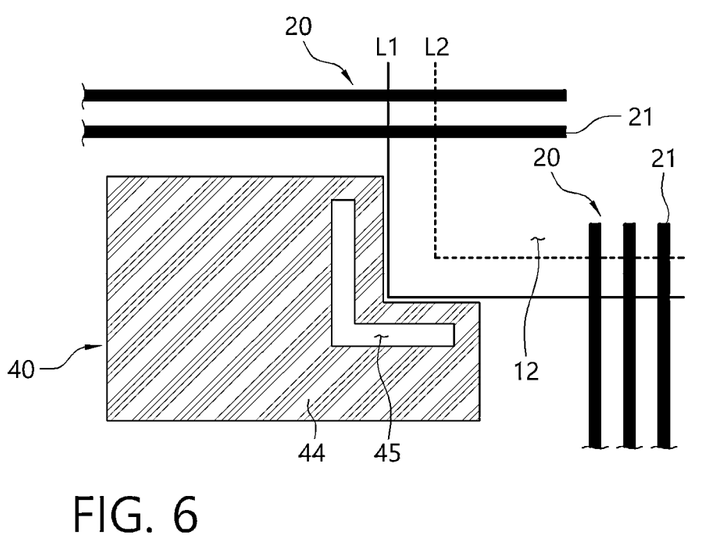

FIGS. 4 to 6 shows views illustrating modification examples of a bleed prevention pattern of a circuit board according to an embodiment of the present invention. All of the modification examples of the bleed prevention pattern shown in FIGS. 4 to 6 are formed in the form of a protruding pattern like the bleed prevention pattern 40 shown in FIGS. 1 to 3.

First, referring to FIG. 4, a first modification example of the bleed prevention pattern 40 can be seen. The first modification example of the bleed prevention pattern 40 includes a first portion 41 formed in a shape surrounding the corner portion in a portion adjacent to the corner portion of the inner lead region 12 of the protective layer formation region 11, and a second portion 42 extending from an end of the first portion 41 in a direction away from the inner lead region 12. In this modification example, the second portion 42 is formed in a shape perpendicular to the first portion 41.

In the first modification example of the bleed prevention pattern 40, the second portion 42 effectively prevents the protective material dispersed by the first portion 41 from passing from the end of the first portion 41 toward the inner lead region 12.

Next, referring to FIG. 5, a second modification example of the bleed prevention pattern 40 is shown. The second modification example of the bleed prevention pattern 40 includes a first portion 41 formed in a shape surrounding the corner portion in a portion adjacent to the corner portion of the inner lead region 12 of the protective layer formation region 11, a second portion 42 extending from an end of the first portion 41 in a direction away from the inner lead region 12, and a third portion 43 formed at a predetermined angle with the second portion 42 so as to surround a predetermined region together with the first portion 41 and the second portion 42. Here, the third portion 43 is formed to be perpendicular to the second portion 42, that is, to form a 90-degree angle.

In the second modification example of the bleed prevention pattern 40, the third portion 43 allows the protective material dispersed by the first portion 41 to stagnate within a predetermined region. In other words, the third portion 43 together with the second portion 42 and the first portion 41 forms a predetermined region where the flow of the protective material is stagnated, thereby effectively preventing the protective material from passing from the end of the first portion 41 toward the inner lead region 12.

Finally, referring to FIG. 6, a third modification example of the bleed prevention pattern 40 is shown. The third modification example of the bleed prevention pattern 40 includes a protruding pattern portion 44 formed protruding from a portion adjacent to the corner portion of the inner lead region 12 of the protective layer formation region 11 to surround the corner portion, and an accommodating portion 45 formed in the protruding pattern portion 44 to accommodate the protective material. The accommodating portion 45 is formed engraved in the protruding pattern.

In the third modification example of the bleed prevention pattern 40, the protruding pattern portion 44 formed to have a relatively large area compared to the first and second modification examples. Accordingly, it may decrease the flowability of the protective material flowing to the upper portion of the protruding pattern portion 44 beyond the protruding pattern portion 44.

In the third modification example of the bleed prevention pattern 40, the accommodating portion 45 serves as a storage tank for accommodating the protective material overflowing the upper portion of the protruding pattern portion 44. The third modification example of the bleed prevention pattern 40 is additionally including an accommodating portion 45 surrounded by the protruding pattern in the protruding pattern portion 44 functioning as a barrier to the protective material, thereby allowing the protective material that goes beyond the protruding pattern portion 44 to the inner lead region 12 to stagnate and be cured in the accommodating portion 45. Accordingly, penetration of the protective material into the inner lead region 12 can be more effectively prevented.

In the third modification example of the bleed prevention pattern 40, a planar area ratio of the protruding pattern portion 44 and the accommodating portion 45 of the bleed prevention pattern 40 may be variously set. For example, the area of the accommodating portion 45 to the area of the protruding pattern portion 44 may be set within a range of 1:0.5 to 30.

Hereinafter, a method for manufacturing a circuit board according to an embodiment of the present invention will be described.

Figure 7:
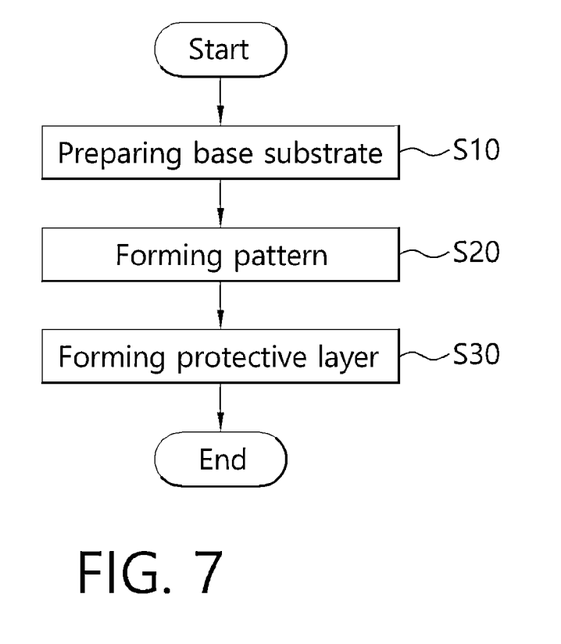
FIG. 7 is a flowchart of a method for manufacturing a circuit board according to an embodiment of the present invention.

FIG. 7 is a flowchart of a method for manufacturing a circuit board according to an embodiment of the present invention. The circuit board 1 according to an embodiment of the present invention as described above may be manufactured through the method for manufacturing a circuit board according to an embodiment of the present invention.

Referring to FIG. 7, the method for manufacturing a circuit board according to an embodiment of the present invention include preparing a base substrate at step S10, forming a pattern at step S20 and forming a protective layer at step S30.

The preparing a base substrate at step S10 is a step of preparing a base substrate 10 in which a protective layer formation region 11 is defined. The protective layer formation region 11 is a region in which the protective layer 30 is formed to prevent damage to the wiring pattern 20. A protective material is fixed in the protective layer formation region 11 to form the protective layer 30.

In the preparing a base substrate at step S10, in the prepared base substrate 10, an inner lead region 12 is defined in addition to the protective layer formation region 11. The inner lead region 12 is a region in which a chip is mounted. A chip mounted on the inner lead region 12 may be a semiconductor chip. More specifically, the chip mounted on the inner lead region 12 may be a display driver integrated circuit, that is, DDI (Display Driver IC). The shape, etc. of the protective layer formation region 11 and the inner lead region 12 are the same as those described in relation to the circuit board 1 according to the embodiment of the present invention.

The forming a pattern at step S20 is a step of forming on the base substrate 10 a wiring pattern 20 and a bleed prevention pattern 40 that is applied to the protective layer formation region 11 to prevent the protective material forming a protective layer 30 from flowing beyond the protective layer formation region 11.

In the forming a pattern at step S20, the wiring pattern 20 is formed on the base substrate 10 to electrically connect a chip mounted on the inner lead region 12 and an external circuit (not shown). In this case, at least a portion of the wiring pattern 20 is formed in the protective layer formation region 11.

In the forming a pattern at step S20, the bleed prevention pattern 40 is formed on the base substrate 10 to prevent the protective material from flowing beyond the protective layer formation region 11 when the protective layer 30 is formed. For example, the bleed prevention pattern 40 may be formed in a portion adjacent to the inner lead region 12 of the protective layer formation region 11, or at a boundary between the protective layer formation region 11 and the inner lead region 12, or the like.

In this case, the bleed prevention pattern 40 may be formed in a protruding pattern. In addition, the bleed prevention pattern 40 may be made of the same material as the wiring pattern 20. Meanwhile, the bleed prevention pattern 40 may be formed to have the same height as the wiring pattern 20. In addition, the bleed prevention pattern 40 may include an accommodating portion 44 engraved in the protruding pattern to accommodate the protective material.

In addition, in relation to the forming a pattern at step S20, details regarding the specific position and shape, etc. of the wiring pattern 20 and the bleed prevention pattern 40 are the same as those described in relation to the circuit board 1 according to an embodiment of the present invention, and thus a detailed description thereof will be omitted.

The forming a protective layer at step S30 is a step of forming a protective layer by applying a protective material on the protective layer formation region 11. The protective layer 30 is formed to protect the wiring pattern 20 from external impacts, corrosion-inducing substances, and the like. Specifically, the protective layer 30 may be formed of a protective material fixed on the protective layer formation region 11 defined on the base substrate 10.

In the forming a protective layer at step S30, the protective material forming the protective layer 30 may be solder resist ink (SR Ink). That is, the protective layer 30 may be formed by applying a solder resist ink on the protective layer formation region 11.

As described above, the protective material forming the protective layer 30 serves to protect the wiring pattern 20 from external impact, corrosion-inducing substances, etc., but when the protective material bleeds to the inner lead region 12 where a semiconductor chip is mounted, it interferes with the connection between the pad portion of the chip mounted on the inner lead region 12 and the lead portion 21 of the wiring pattern 20, thereby causing deterioration of the quality of the circuit board 1. However, according to the method for manufacturing a circuit board according to an embodiment of the present invention, the bleed prevention pattern 40 formed in the forming a pattern at step S20 physically blocks the flow of the protective material applied when the protective layer 30 is formed, thereby preventing a bleed phenomenon in which the protective material flows beyond the protective layer formation region 11 to other regions of the circuit board 1, in particular, to the inner lead region 12.

Although embodiments of the present invention have been described, the spirit of the present invention is not limited to the embodiments set forth herein. Those of ordinary skill in the art who understand the spirit of the present invention may easily propose other embodiments through supplement, change, removal, addition, etc. of elements within the same spirit, but the embodiments will be also within the scope of the present invention.

What is claimed is:

1. A circuit board comprising:
a base substrate in which a protective layer formation region is defined;
a wiring pattern which is formed on the base substrate and which has at least a portion formed in the protective layer formation region;
a protective layer fixed onto the protective layer formation region and formed of a protective material; and
a bleed prevention pattern formed on the base substrate so as to prevent the protective material from flowing beyond the protective layer formation region when the protective layer is formed,
wherein an inner lead region in which a chip is mounted is additionally defined in the base substrate,
wherein the bleed prevention pattern is formed in an area outside the inner lead region, adjacent to a corner of a boundary of the inner lead region where the wiring pattern is not formed, and within the protective layer formation region, and comprises a dam that is configured to physically block a flow of the protective material and prevent the protective material from flowing into the inner lead region when forming the protective layer.

2. The circuit board of claim 1, wherein the bleed prevention pattern comprises a first portion formed to surround the corner.

3. The circuit board of claim 2, wherein the bleed prevention pattern further comprises a second portion extending from an end of the first portion in a direction away from the inner lead region.

4. The circuit board of claim 3, wherein the bleed prevention pattern further comprises a third portion formed at a predetermined angle with the second portion so as to surround a predetermined region together with the first portion and the second portion.

5. The circuit board of claim 1, wherein the bleed prevention pattern is formed in a protruding pattern.

6. The circuit board of claim 5, wherein the bleed prevention pattern is formed to have the same height as the wiring pattern.

7. The circuit board of claim 5, wherein the bleed prevention pattern comprises an accommodating portion for accommodating the protective material in the protruding pattern.

8. The circuit board of claim 7, wherein the accommodating portion is formed engraved in the protruding pattern.

9. The circuit board of claim 1, wherein the bleed prevention pattern contacts the protective layer.

10. The circuit board of claim 1, wherein the bleed prevention pattern comprises an additional dam, and the protective layer comprises a portion interposed between the dam and the additional dam when viewed in a thickness direction of the base substrate.

11. The circuit board of claim 1, wherein the bleed prevention pattern is formed at a location 150 µm to 250 µm away from the inner lead region.

* * * * *